US007348651B2

(12) United States Patent
Yaung

(10) Patent No.: US 7,348,651 B2
(45) Date of Patent: Mar. 25, 2008

(54) PINNED PHOTODIODE FABRICATED WITH SHALLOW TRENCH ISOLATION

(75) Inventor: Dun-Nian Yaung, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 284 days.

(21) Appl. No.: 11/007,935

(22) Filed: Dec. 9, 2004

(65) Prior Publication Data

US 2006/0125035 A1 Jun. 15, 2006

(51) Int. Cl.
*H01L 31/103* (2006.01)
(52) U.S. Cl. .............................. 257/446; 257/E31.057
(58) Field of Classification Search ................ 257/297, 257/446, 452, 519, 545, 617, E27.13, E31.057
See application file for complete search history.

(56) References Cited

U.S. PATENT DOCUMENTS

| 5,859,450 | A * | 1/1999 | Clark et al. ................. 257/233 |
| 6,297,070 | B1 | 10/2001 | Lee et al. ...................... 438/57 |
| 6,410,359 | B2 | 6/2002 | Connolly et al. ............. 438/48 |
| 6,900,484 | B2 * | 5/2005 | Rhodes ....................... 257/292 |
| 2003/0169359 | A1 * | 9/2003 | Merrill et al. ............... 348/308 |
| 2004/0021194 | A1 * | 2/2004 | Mann .......................... 257/506 |
| 2005/0045926 | A1 * | 3/2005 | Mouli .......................... 257/294 |
| 2005/0184321 | A1 * | 8/2005 | Luo ............................. 257/292 |

OTHER PUBLICATIONS

Kwon, Hyuck In, Dark Current Characterization of the CMOS APS Imagers Fabricated Using a 0.18 μm CMOS Technology, SMDL Annual Report 20003, School of Electrical Eng., Seoul Nat'l Univ.

* cited by examiner

*Primary Examiner*—Carl Whitehead, Jr.
*Assistant Examiner*—Jennifer M. Dolan
(74) *Attorney, Agent, or Firm*—Duane Morris LLP

(57) ABSTRACT

A method and system is disclosed for reducing or eliminating leakage between a pinned photodiode and shallow trench isolation structure fabricated therewith while optimizing the sensitivity of the photodiode. Provided is a system with an N+ region implanted in a P-type substrate; a P-type well separating the N+ region from the shallow trench isolation (STI) structure; and at least a P+ region over the N+ region, and overlapping at least part of the P-type well and a substrate portion between the N+ region and P-type well. The space between the N+ region and a damaged region adjacent the STI is greater than the distance that the depletion region between the N+ region and the P-type well, expands. The junctions of the various features are optimized to maximize a photosensitive response for the wavelength of the absorbed light as well as reducing or eliminating electrical leakage.

20 Claims, 2 Drawing Sheets

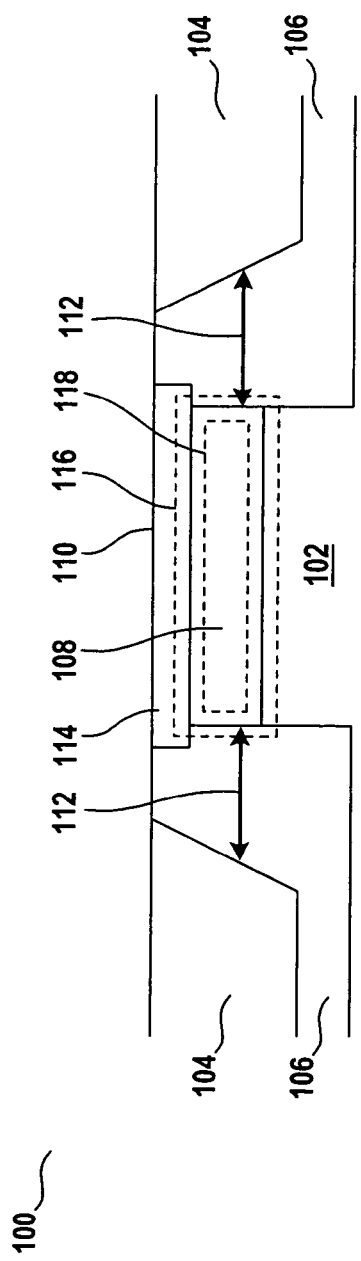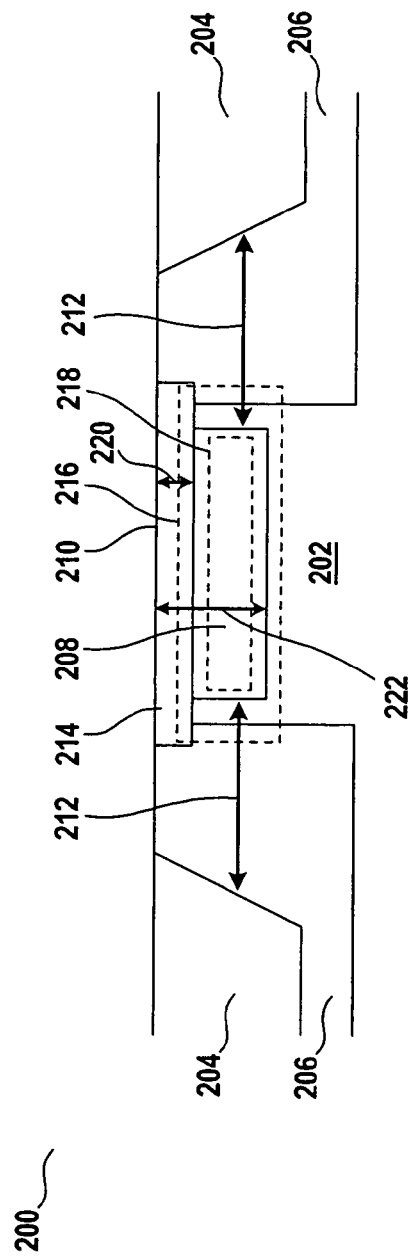

PINNED PHOTODIODE FABRICATED WITH SHALLOW TRENCH ISOLATION

BACKGROUND

The present invention relates generally to integrated circuit designs, and more particularly to a system reducing or eliminating leakage between a pinned photodiode and shallow trench isolation fabricated therewith.

Semiconductor integrated circuit (IC) chips can be produced to function as image photosensors for image applications such as camera devices. A semiconductor photosensor produces signals that are proportional to light images by reading a predetermined number of individual pixels of an image. At least one device, such as a photodiode, is required for each pixel. By further incorporating a plurality of electronic reading and decoding circuitries, an array of image photosensors may digitally record an image with a predetermined pixel resolution.

Charge coupled devices (CCD) have been produced for this purpose with pinned photodiodes. In a pinned photodiode, a N+ region acts as a pixel sensor and is isolated from the surface of the IC by a P+ region. However, CCDs are typically difficult to integrate with logic circuits that might include metal-oxide-semiconductor field-effect-transistors (MOSFETs). Since MOSFETs are typically constructed with shallow trench isolation (STI), which is proved to be quite difficult to be integrated with pinned photodiodes, their mutual existence has been a challenging question for IC designers. In theory, STI is a device isolation structure of channels that are typically filled with oxide. The semiconductor crystal sidewalls of STI are damaged by the dry etch that is used to produce them. The sidewalls are further damaged by stresses that arise from the extreme temperature cycles that occur in semiconductor processing. The difficulty is that such damage causes electrical leakage if an electrical junction expands to such a damaged region.

Any electrical leakage appears as a signal in darkness. Such dark current reduces sensitivity and the quality of image depiction. Dark current can be generated by several typical structures in semiconductor devices. Electrical junctions that meet the oxide-covered surface are imperfect and can generate dark current. Shallow trench isolation between devices is produced by dry etching that damages the semiconductor crystal. If that damaged material is included in a junction depletion region, dark current can be generated.

Dark current is a bane of camera image quality. Therefore, desirable in the art of pinned photodiode designs are additional systems to integrate shallow trench isolation structures therewith, thereby improving image quality and overall IC performance. Prior attempts to reduce leakage and dark current typically do so at the expense of photodiode sensitivity. As such, it would be particularly desirable to provide a pinned photodiode that is resistant to leakage and dark current effects without compromising sensitivity.

SUMMARY

In view of the foregoing, the following provides a system to reduce or eliminate leakage between a pinned photodiode and shallow trench isolation fabricated therewith.

In one embodiment, a system comprises at least a N+ region implanted on a P-type substrate; at least a P-type well surrounding the N+ region for separating the N+ region from a shallow trench isolation; and at least a P+ region overlapping the N+ region, and further overlapping at least part of the P-type well to form a pinned photodiode, wherein a space between the N+ region and the shallow trench isolation provides a distance for the expansion of a depletion region between the N+ region and a first area comprising the P+ region, the P-type substrate and the P-type well, the space for reducing or eliminating electrical leakage and the depletion region for facilitating a photosensitive response during the operation of the pinned photodiode.

The sensitivities of the various pinned photodiodes may be optimized for the detection of different wavelengths of light. For example, for the detection of red light, the junction between the N+ region and the substrate may be about 0.8 microns or greater. For the optimal detection of blue light, the junction between the P+ region and the N+ region may be less than about 0.2 microns. For the detection of green light, the lower junction of the N+ region and the P-type wells may have the same depth of about 0.2 to 0.8 microns.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 illustrates a cross section of a conventional design with a pinned photodiode fabricated alongside a shallow trench isolation, according to the Prior Art.

FIG. 2 illustrates a cross section of a pinned photodiode fabricated alongside a shallow trench isolation in accordance with one embodiment of the present invention.

DESCRIPTION

Figure 3:
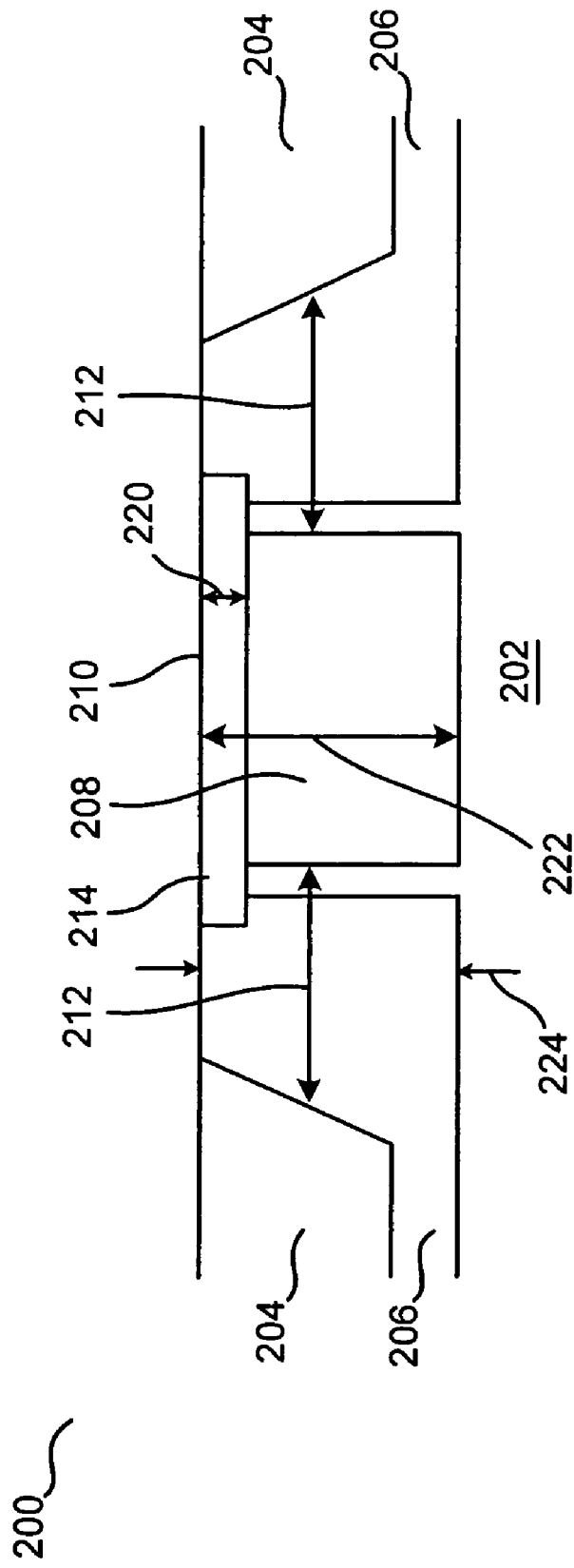
FIG. 3 illustrates a cross section of a pinned photodiode fabricated alongside a shallow trench isolation in accordance with a further embodiment of the present invention.

The following will provide a detailed description of a system to reduce or eliminate leakage between a pinned photodiode and shallow trench isolation fabricated therewith.

FIG. 1 illustrates a cross section 100 of a conventional design with a pinned photodiode having a N+ photosensitive region, adjacent to a P-type well and surrounded just inside a STI. Segmenting a semiconductor P-type substrate 102 is a ring, typically rectangular, of a dielectric STI 104. Adjacent to the inner wall and the bottom of the STI 104 is a ring of diffused P-type well 106. A N+ region 108 is implanted to a substrate surface 110 of the P-type substrate 102.

The N+ region 108 spans the area inside the ring of P-type well 106 such that the N+ region 108 is isolated from the STI 104 by a distance 112, which is the same as the width of the P-type well 106. The P-type well 106, or other diffusion, has a heavier doping than has the P-type substrate 102. A shallow P+ region 114 spans the entire substrate surface 110 of the P-type substrate 102 interior to the P-type well 106, and further overlaps part of the P-type well 106. This overlapping is effectively the P-type pinning implant of the photodiode. It subdues the N+ region 108 beneath the substrate surface 110. Since this P+ region 114 is more heavily doped than is the N+ region 108, the P+ doping overpowers the N+ doping, thereby isolating the N+ region 108 from the substrate surface 110. The purpose of isolating the N+ region from the substrate surface 110 is to further reduce leakage. Here, the junction of the N+ region 108 does not reach the substrate surface 110 where it could cause electrical leakage.

The boundary surfaces between the N+ type interior to the N+ region 108 and the various P-type regions outside that region constitute an electrical junction. For example, the N+ region 108 is enclosed by the P+ region 114 at the top, the P-type well 106 at the sides, and the P-type substrate 102 at the bottom. When this electrical junction is reverse-biased, with a positive bias on the N-type interior and a relatively negative bias on the P-type exterior, the depletion region of the electrical junction expands outward to an outer surface 116 and inward to an inner surface 118.

It is the volume of the depletion region between the outer surface 116 and the inner surface 118 that is the photosensitive element. Within this volume, absorbed light generates paired electrons and holes that are driven in opposite directions and collected as photocurrent. Photocurrent is also collected from within a carrier diffusion length of the depletion region. This larger sensitive volume has slightly slower response.

The pinned photodiode thus has two photosensitive depletion regions that are parallel to the substrate surface 110, one at the top and one at the bottom of the N+ region 108. The upper photosensitive depletion region is closer to the substrate surface 110 and therefore is more responsive to a blue light which has a shorter wavelength. So, this extra photosensitive depletion region at the top of the N+ region 108 increases photosensitivity and shifts the sensitivity towards the blue region of the photo spectrum.

The degree of doping on each side of the electrical junction and the ratio of doping on the two sides of the junction determine the extension of the depletion region in each surface direction. The depletion region expands little, along a portion of the outer surface 116, into the P+ region 114, because of its heavy P-type doping. The depletion region expands slightly further, along a portion of the inner surface 118 into the N+ region 108, because the doping is heavy, but less than the doping of the P+ region 114. The depletion region expands more into the P-type well 106, where the doping is less heavy than that in either the N+ region 108 or the P+ region 114. The depletion region expands the most, along the bottom portion of the outer surface 116, into the P-type substrate 102.

The distance 112 allows space for the depletion to expand, with voltage, into the P-type well 106. It is desired to prevent the depletion region from expanding into any damaged region of the P-type well 106 that is immediately adjacent to the STI 104. This damaged region, typically caused by dry etching of the trench, is a substrate crystal in the P-type well 106 that is immediately adjacent to the STI 104. This damaged region would cause electrical leakage if any portion of the junction depletion region that surrounds the N+ region 108 extends too near to the damage. In conventional structures, however, the depletion region expands into the damaged region causing electrical leakage.

FIG. 2 illustrates a cross section 200 of an improved design with a pinned photodiode fabricated alongside a STI in accordance with one embodiment of the present invention. A space between a N+ photosensitive region of the pinned photodiode and a P-type well surrounding it is extended to further reduce leakage. Segmenting a semiconductor P-type substrate 202 is a ring, typically rectangular, of a dielectric STI 204. Adjacent to the inner wall and the bottom of the STI 204 is a ring of diffused P-type well 206. A N+ region 208 is implanted and diffused from a substrate surface 210 of the P-type substrate 202.

With reference to FIG. 1, the distance 112 separating the N+ region 108 from the STI 104, is the width of the P-type well 106. According to an embodiment of the invention illustrated in FIG. 2, a distance 212 separating the N+ region 208 from the STI 204 is the width of the P-type well 206 plus a space of the P-type substrate 202. In an exemplary embodiment, distance 212 may range from 0.1 um to 0.8 um but may vary in various other exemplary embodiments. The purpose of this space of the P-type substrate 202 is to provide a longer distance between the N+ photosensitive region and the STI to further reduce electrical leakage. Here, the depletion region expands somewhat with voltage into the space of the P-type substrate 202 before it encounters the heavier doping of the P-type well 206. In this embodiment, a little more voltage means a little additional expansion of the depletion region into the P-type well 206. In other words, the space provides additional protection from leakage because the depletion region does not approach as closely to any damaged semiconductor crystal that lies in a boundary between the STI 204 and the P-type well 206 as to a conventional pinned photodiode design.

The P-type well 206, or other diffusion, has heavier doping than has the P-type substrate 202. This heavier doping prevents the depletion region that surrounds the N+ region 208 from extending to the damaged material at the boundary between the P-type well 206 and the STI 204. Some of the P-type substrate 202 material can be left to occupy the space. The part of the substrate crystal in the P-type well 206, immediately adjacent to the STI 204, is damaged by a dry etch operation producing it. This would cause electrical leakage if any portion of the junction depletion region that surrounds the N+ region 208 extends too near to the damage. The spacing of distance 212 allows more voltage to be applied to form a larger depletion region to improve sensitivity of the photodiode without concern that the depletion region will expand laterally into the damaged region of the P-type well that is immediately adjacent STI 204 and cause leakage.

A shallow P+ region 214 spans the entire substrate surface 210 of the P-type substrate 202 interior to the ring of the P-type well 206, and further overlaps the P-type well 206. This overlapping is essentially the P-type pinning implant of the photodiode. The P+ region 214 subdues the N+ region 208 beneath the substrate surface 210. The P+ region 214 advantageously includes a higher impurity concentration than P-type well 206. Since this P+ region 214 is more heavily doped than is the N+ region 208, the P+ doping overpowers the N+ doping, while the P+ region 214 isolates the N+ region 208 from the substrate surface 210. The purpose of isolating the N+ region from the substrate surface 210 is to further reduce leakage. Here, the junction of the N+ region 208 does not reach the substrate surface 210 where it could cause electrical leakage.

The N+ region 208 is isolated beneath the substrate surface 210. The boundary surfaces between the N+ type interior of the N+ region 208 and the various P-type regions outside it constitute an electrical junction. As shown, the N+ region 208 is surrounded by a P-type area comprising the P+ region 214 on top and portions of the P-type substrate 202 on all other sides. When the electrical junction is reverse-biased, with a positive bias on the N-type interior and a relatively negative bias on the P-type exterior, the depletion region of the electrical junction expands outward to an outer surface 216 and inward to an inner surface 218. As it can be seen, the depletion region defined by the outer surface 216 and inner surface 218 is bigger than that in the prior art, and it helps to absorb short wavelength lights such as the blue light. In an exemplary embodiment, the width of the depletion region, i.e., the perpendicular distance between outer surface 216 and inner surface 218, may range from 0.01 to 0.2 microns. Distance 212 is chosen so that, when the depletion region expands to a maximum expansion width, it does not reach the damaged region adjacent the STI 204, which faces the N+ region 208. The maximum expansion width of the depletion region may range from 0.05 to 0.7 microns in one exemplary embodiment, but may vary in other exemplary embodiments.

Provided is a pinned photodiode that isolates the photosensitive junction area from the surface of the semiconductor substrate, thereby reducing the leakage that would otherwise be generated by the meeting of the electrical junction and the imperfect interface between the semiconductor crystal and the oxide. Some structure that provides heavier doping adjacent to the surrounding STI reduces leakage that otherwise would be generated by the meeting of the junction depletion region and the substrate material damaged by the dry etching that produces the STI. By including an additional space between the photodiode and the surrounding heavy doping structure, leakage is reduced, thereby improving image quality produced by the photodiode.

FIG. 3 shows another exemplary pinned photodiode in which the N+ region 208 extends to the same depth as the P-type wells 206. Like reference numerals denote like features throughout the specification and it can be seen that N+ region 208 includes a greater relative depth 222 than in FIG. 2. The depletion region, described in conjunction with FIGS. 1 and 2, is not shown.

The sensitivities of the various pinned photodiodes may be optimized for detection of different wavelengths of light. Longer wavelength light is absorbed by deeper junctions so the structures and associated depletion regions may be so formed. For example, for the detection of red light, the junction between the N+ region 208 and the P-type substrate 202 (depth 222) may be about 0.8 microns or greater. For the optimal detection of blue light, the junction between P+ region 214 and N+ region 208 (depth 220) may be less than about 0.2 microns. In another embodiment illustrated in FIG. 3., a pinned photodiode optimized for the detection of green light may include the N+ region 208/P-type substrate 202 depth being substantially equal to the depth 224 of the P-type wells and about 0.2 to 0.8 microns.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor structure to reduce or eliminate electrical leakage between a pinned photodiode and a shallow trench isolation structure, the semiconductor structure comprising:

a first region of a first impurity type formed beneath a surface of a semiconductor substrate of a second impurity type and disposed between portions of a shallow trench isolation (STI) structure that surrounds the first region;

a semiconductor well of a second impurity type laterally separating the first region from the STI structure at all points on an inner periphery of the STI structure and including a damaged portion adjacent the STI structure at all points on the inner periphery of the STI structure and facing the first region;

a substrate portion of the semiconductor substrate interposed between the first region and the semiconductor well all locations on an inner periphery of the semiconductor well;

a second region of the second impurity type covering the first region and the substrate portion and overlapping at least part of the semiconductor well at all points along the inner periphery of semiconductor well, the second region formed within the semiconductor substrate and extending downwardly from the surface;

an expandable depletion region formed along a boundary between the first region and the substrate portion, a lateral spacing between the first region and the adjacent damaged portion sufficient to prevent the depletion region from expanding into the damaged portion at a maximum expansion of the depletion region, and the first region having a lower boundary more than about 0.8 microns below the surface.

2. The structure of claim 1, wherein the first impurity type is N-type and the second impurity type is P-type.

3. The structure of claim 2, wherein the P-type impurity concentration in the semiconductor well is higher than the P-type impurity concentration in the semiconductor substrate.

4. The structure of claim 1, wherein the depletion region attains the maximum expansion when a junction between the first region and the substrate portion is reverse-biased, the maximum expansion including the depletion region having a thickness of about 0.05 to 0.7 um.

5. The structure of claim 4, wherein when the junction between the first region and the substrate portion is reverse-biased, the depletion region has a relatively positive bias in the first region and a relatively negative bias In the substrate portion and expands inwardly to an inner boundary in the first region and outwardly to an outer boundary between the first region and the associated adjacent damaged portion.

6. The structure of claim 1, wherein a concentration of the second impurity type in the second region is greater than a concentration of the first impurity type in the first region.

7. The structure of claim 1, wherein the second region includes a greater concentration of the second impurity than the semiconductor well, the second impurity type being P-type.

8. A semiconductor structure to reduce or eliminate electrical leakage between a pinned photodiode and a shallow trench isolation structure, the semiconductor structure comprising:

a first region of a first impurity type formed beneath a surface of a semiconductor substrate of a second impurity type and disposed between portions of a shallow trench isolation (STI) structure that surrounds the first region;

a semiconductor well of a second impurity type laterally separating the first region from the STI structure at all points on an inner periphery of the STI structure and including a damaged portion adjacent the STI structure at all points the inner periphery of the STI structure and facing the first region;

a substrate portion of the semiconductor substrate interposed between the first region and the semiconductor well at all locations an inner periphery of the semiconductor well;

a second region of the second impurity type covering the first region and the substrate portion and overlapping at least part of the semiconductor well at all points along the inner periphery of the semiconducter well, the second region formed within the semiconductor substrate and extending downwardly from the surface;

an expandable depletion region formed along a boundary between the first region and the substrate portion, a lateral spacing between the first region and the adjacent damaged portion sufficient to prevent the depletion region from expanding into the damaged portion at a maximum expansion of the depletion region, and the first region having a lower boundary at substantially the same depth as a lower boundary of the semiconductor well and disposed about 0.2 to 0.8 microns below the surface.

9. The structure claim 8, wherein the first impurity type is N-type and the second impurity type is P-type.

10. The structure of claim 9, wherein the P-type impurity concentration in the semiconductor well is higher than the P-type impurity concentration in the semiconductor substrate.

11. The structure of claim 8, wherein the depletion region attains the maximum expansion when a junction between the first region and the substrate portion is reverse-biased, the maximum expansion Including the depletion region having a thickness of about 0.05 to 0.7um.

12. The structure of claim 11, wherein when the junction between the first region and the substrate portion is reverse-biased, the depletion region has a relatively positive bias in the first region and a relatively negative bias in the substrate portion and expands inwardly to an inner boundary in the first region and outwardly to an outer boundary between the first region and the associated adjacent damaged portion.

13. The structure of claim 8, wherein a concentration of the second impurity type in the second region is greater than a concentration of the first impurity type in the first region.

14. The structure of claim 8, wherein the second region includes a greater concentration of the second impurity than the semiconductor well, the second impurity type being P-type.

15. A semiconductor structure to reduce or eliminate electrical leakage between a pinned photodiode and a shallow trench isolation structure, the semiconductor structure comprising:

a first region of a first impurity type formed beneath a surface of a semiconductor substrate of a second impurity type and disposed between portions of a shallow trench isolation (STI) structure that surrounds the first region;

a semiconductor well of a second impurity type laterally separating the first region from the STI structure at all points on an inner periphery of the STI structure and including a damaged portion adjacent the STI structure at all points on the inner periphery of the STI structure and facing the first region;

a substrate portion of the semiconductor substrate interposed between the first region end the semiconductor well at all locations on an inner periphery of the semiconductor well;

a second region of the second impurity type covering the first region and the substrate portion and overlapping at least part of the semiconductor well at all points along the inner periphery of the semiconductor well, the second region formed within the semiconductor substrate and extending downwardly from the surface to a depth no more than about 0.2 microns;

an expandable depletion region formed along a boundary between the first region and the substrate portion, and a lateral spacing between the first region and the adjacent damaged portion sufficient to prevent the depletion region from expanding into the damaged portion at a maximum expansion of the depletion region, wherein the first impurity type is N-type and the second impurity type is P-type.

16. The structure of claim 15, wherein the P-type impurity concentration in the semiconductor well is higher than the P-type impurity concentration in the semiconductor substrate.

17. The structure of claim 15, wherein the depletion region attains the maximum expansion when a junction between the first region and the substrate portion is reverse-biased, the maximum expansion including the depletion region having a thickness of about 0.05 to 0.7 um.

18. The structure of claim 17, wherein when the junction between the first region and the substrate portion is reverse-biased, the depletion region has a relatively positive bias in the first region and a relatively negative bias in the substrate portion and expands inwardly to an Inner boundary in the first region and outwardly to an outer boundary between the first region and the associated adjacent damaged portion.

19. The structure of claim 15, wherein a concentration of the second impurity type in the second region is greater than a concentration of the first impurity type in the first region.

20. The structure of claim 15, wherein the second region includes a greater concentration of the second impurity than the semiconductor well, the second impurity type being P-type.

* * * * *

UNITED STATES PATENT AND TRADEMARK OFFICE
CERTIFICATE OF CORRECTION

PATENT NO. : 7,348,651 B2  
APPLICATION NO. : 11/007935  
DATED : March 25, 2008  
INVENTOR(S) : Dun-Nian Yaung It is certified that error appears in the above-identified patent and that said Letters Patent is hereby corrected as shown below:

Column 6, line 9, after "well" insert -- at --.

Column 6, line 14, after "of" insert -- the --.

Column 6, line 39, delete "In" and insert -- in -- therefor.

Column 7, line 8, delete "semiconducter" and insert -- semiconductor --.

Column 7, line 30, delete "Including" and insert -- including -- therefor.

Column 8, line 8, delete "end" and insert -- and -- therefor.

Column 8, line 39, delete "Inner" and insert -- inner -- therefor.

Signed and Sealed this

Thirty-first Day of August, 2010

David J. Kappos  
*Director of the United States Patent and Trademark Office*